(12) United States Patent
Chen et al.

(10) Patent No.: US 10,497,860 B2
(45) Date of Patent: Dec. 3, 2019

(54) PERPENDICULAR MAGNETIC RANDOM-ACCESS MEMORY (MRAM) FORMATION BY DIRECT SELF-ASSEMBLY METHOD

(71) Applicant: Taiwan Semiconductor Manufacturing Co., Ltd., Hsin-Chu (TW)

(72) Inventors: Chih-Ming Chen, Hsinchu (TW); Chern-Yow Hsu, Chu-Bei (TW); Szu-Yu Wang, Hsinchu (TW); Chung-Yi Yu, Hsin-Chu (TW); Chia-Shiung Tsai, Hsin-Chu (TW); Xiaomeng Chen, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/990,911

(22) Filed: Jan. 8, 2016

(65) Prior Publication Data
US 2016/0118577 A1    Apr. 28, 2016

Related U.S. Application Data

(62) Division of application No. 14/023,552, filed on Sep. 11, 2013, now Pat. No. 9,257,636.

(51) Int. Cl.
*H01L 43/02* (2006.01)
*H01L 43/08* (2006.01)
(Continued)

(52) U.S. Cl.
CPC .......... *H01L 43/08* (2013.01); *H01L 27/1222* (2013.01); *H01L 43/02* (2013.01);
(Continued)

(58) Field of Classification Search
CPC ....... H01L 43/02; H01L 43/12; H01L 27/222; H01L 27/224; H01L 27/228
See application file for complete search history.

(56) References Cited

U.S. PATENT DOCUMENTS 6,897,532 B1    5/2005  Schwarz et al.
7,416,945 B1    8/2008  Muralidhar et al.
(Continued)

OTHER PUBLICATIONS

Sungwook Jung, et al.; "Fabrication of Needle-Like Nanostructures Using Block Copolymer for Non-Volatile Memory"; Materials Science and Engineering; www.elsevier.com/locate/msec; C27, 2007, p. 1452-1455.
(Continued)

*Primary Examiner* — Daniel Whalen
*Assistant Examiner* — Scott Stowe
(74) *Attorney, Agent, or Firm* — Eschweiler & Potashnik, LLC

(57) ABSTRACT

Some embodiments of the present disclosure relate to a method that achieves a substantially uniform pattern of magnetic random access memory (MRAM) cells with a minimum dimension below the lower resolution limit of some optical lithography techniques. A copolymer solution comprising first and second polymer species is spin-coated over a heterostructure which resides over a surface of a substrate. The heterostructure comprises first and second ferromagnetic layers which are separated by an insulating layer. The copolymer solution is subjected to self-assembly into a phase-separated material comprising a pattern of micro-domains of the second polymer species within a polymer matrix comprising the first polymer species. The first polymer species is then removed, leaving a pattern of micro-domains of the second polymer species. A pattern of magnetic memory cells within the heterostructure is formed
(Continued)

by etching through the heterostructure while utilizing the pattern of micro-domains as a hardmask.

20 Claims, 8 Drawing Sheets

(51) Int. Cl.
  *H01L 43/12* (2006.01)
  *H01L 27/12* (2006.01)
  *H01L 43/10* (2006.01)
  *G11C 11/16* (2006.01)

(52) U.S. Cl.
  CPC .............. *H01L 43/10* (2013.01); *H01L 43/12* (2013.01); *G11C 11/161* (2013.01)

(56) References Cited

U.S. PATENT DOCUMENTS

| | | | |
|---|---|---|---|
| 7,932,189 | B2 | 8/2011 | Merchant et al. |
| 8,546,871 | B2 | 10/2013 | Huang et al. |
| 8,747,680 | B1 | 6/2014 | Deshpande et al. |
| 8,923,044 | B2 | 12/2014 | Li et al. |
| 2004/0205958 | A1 | 10/2004 | Grynkewich et al. |
| 2009/0130779 | A1 | 5/2009 | Li et al. |
| 2009/0209050 | A1 | 8/2009 | Wang et al. |
| 2010/0053823 | A1* | 3/2010 | Iwayama ............... B82Y 25/00 360/324.2 |
| 2010/0102406 | A1 | 4/2010 | Xi et al. |
| 2010/0117169 | A1 | 5/2010 | Anderson et al. |
| 2011/0008956 | A1 | 1/2011 | Lee et al. |
| 2011/0049656 | A1 | 3/2011 | Li et al. |
| 2011/0076784 | A1 | 3/2011 | Druist et al. |
| 2011/0104827 | A1 | 5/2011 | Gaidis |
| 2011/0235217 | A1 | 9/2011 | Chen et al. |
| 2012/0139069 | A1* | 6/2012 | Kim ....................... H01L 27/228 257/421 |
| 2012/0205764 | A1 | 8/2012 | Chen et al. |
| 2012/0217476 | A1 | 8/2012 | Ikeno |
| 2012/0230089 | A1* | 9/2012 | Yamada ................. G11C 11/16 365/158 |
| 2013/0029431 | A1 | 1/2013 | Takahashi |
| 2013/0034917 | A1 | 2/2013 | Lee |
| 2013/0062714 | A1 | 3/2013 | Zhu et al. |
| 2013/0069182 | A1 | 3/2013 | Ohsawa |
| 2013/0337582 | A1 | 12/2013 | Satoh et al. |
| 2014/0070162 | A1* | 3/2014 | Iwayama ................ H01L 43/08 257/4 |
| 2015/0021725 | A1 | 1/2015 | Hsu et al. |
| 2015/0102006 | A1 | 4/2015 | Mudivarthi et al. |
| 2015/0171314 | A1 | 6/2015 | Li et al. |
| 2015/0255507 | A1 | 9/2015 | Pakala et al. |
| 2015/0287910 | A1 | 10/2015 | Lu et al. |
| 2015/0287912 | A1 | 10/2015 | Park |

OTHER PUBLICATIONS

Hiratsuka, et al. "Fabrication of perpendicularly magnetized magnetic tunnel junctions with L10-CoPt/Co2MnSi hybrid electrode." Journal of Applied Physics 107, 09C714 (2010). May 6, 2010.
Endoh "Emerging Research Memory Technologies Spin Transfer Torque MRAM (SPRAM) and its Applications." Feb. 28, 2010.
Natarajarathinam. "Exploration of Perpendicular Magnetic Anisotropy Material System for Application in Spin Transfer Torque—Random Access Memory (STT-RAM)." Tuscaloosa, Alabama, 2012.
U.S. Appl. No. 14/608,313, filed Jan. 29, 2015.
U.S. Appl. No. 14/645,683, filed Mar. 12, 2015.
Y. J. Lee, et al., "Demonstration of Chip Level Writability, Endurance and Data Retention of an Entire 8MB STT-MRAM Array," 2013 International Symposium on VLSI Technology, Systems, and Applications (VLSI-TSA), p. 1-2, Apr. 22-24, 2013.
Non-Final Office Action dated May 26, 2015 for U.S. Appl. No. 14/023,552.
Notice of Allowance dated Sep. 23, 2015 for U.S. Appl. No. 14/023,552.
Non Final Office Action dated Feb. 25, 2016 U.S. Appl. No. 14/608,313.
Notice of Allowance dated Feb. 22, 2018 U.S. Appl. No. 14/645,683.
Non-Final Office Action dated Jun. 17, 2016 for U.S. Appl. No. 14/645,683.
Non-Final Office Action dated Aug. 25, 2017 U.S. Appl. No. 14/645,683.
Final Office Action dated Jun. 3, 2016 U.S. Appl. No. 14/608,313.
Notice of Allowance dated Sep. 16, 2016 U.S. Appl. No. 14/608,313.
Final Office Action dated Dec. 29, 2016 U.S. Appl. No. 14/645,683.

* cited by examiner

"0"
Low resistance state

"1"
High resistance state

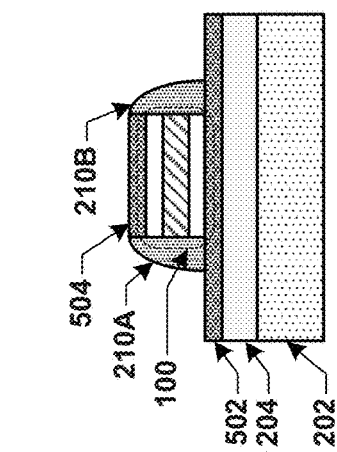
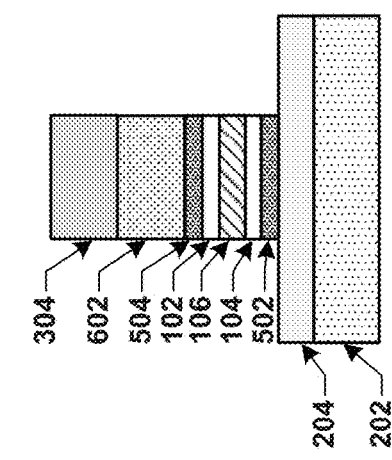
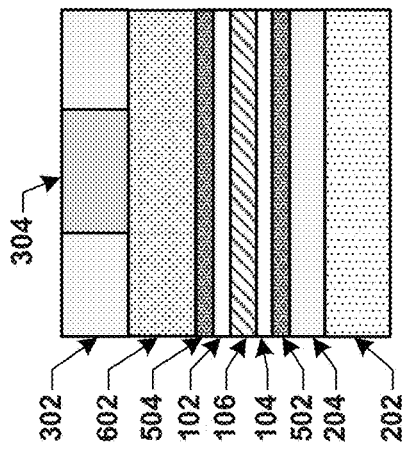
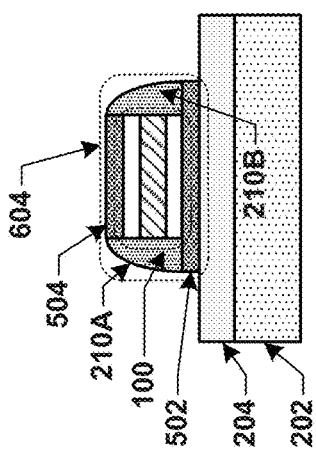
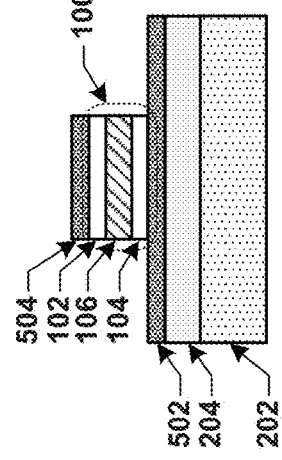
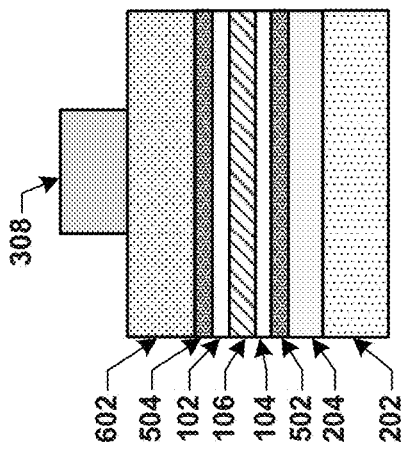

PERPENDICULAR MAGNETIC RANDOM-ACCESS MEMORY (MRAM) FORMATION BY DIRECT SELF-ASSEMBLY METHOD

REFERENCE TO RELATED APPLICATION

This Application is a divisional of U.S. application Ser. No. 14/023,552, filed on Sep. 11, 2013, the contents of which are incorporated by reference in their entirety.

BACKGROUND

The following disclosure relates to non-volatile memory (NVM), and in particular to magnetic random access memory (MRAM). MRAM offers comparable performance to volatile static random access memory (SRAM) and comparable density with lower power consumption to volatile dynamic random access memory (DRAM). Compared to NVM Flash memory, MRAM offers much faster access times and suffers minimal degradation over time, whereas Flash memory can only be rewritten a limited number of times.

An MRAM cell is formed by a magnetic tunneling junction (MTJ) comprising two ferromagnetic layers which are separated by a thin insulating barrier, and operates by tunneling of electrons between the two ferromagnetic layers through the insulating barrier. Scaling of MRAM memory cells in advanced technology nodes (i.e., Node 28 and beyond) is limited by the resolution limit of optical lithography. At the lower resolution limit of optical lithography MJT size variation between MRAM cells within an MRAM array can degrade memory performance.

BRIEF DESCRIPTION OF THE DRAWINGS

FIGS. 6A-6F of illustrate cross-sectional views of some embodiments of MRAM cell array patterning with a block copolymer and hardmask (HM).

DETAILED DESCRIPTION

Figure 1A:
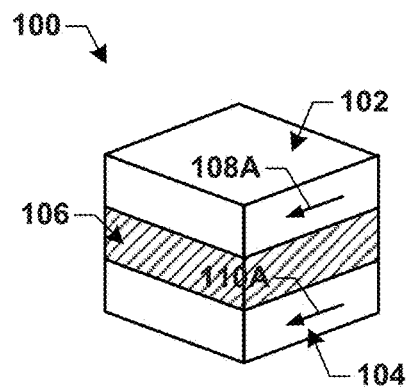
FIGS. 1A-1B illustrate perspective views of a magnetic tunneling junction (MJT) within an MRAM cell.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

Figure 1B:
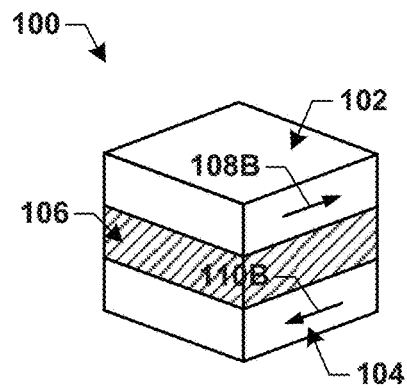

Some aspects of the present disclosure relate to scaling techniques for magnetic random access memory (MRAM) cells. FIGS. 1A-1B illustrate perspective views of an MJT 100 within an MRAM memory cell. The MJT 100 includes an upper ferromagnetic plate 102 and a lower ferromagnetic plate 104, which are separated by a thin insulating layer 106, also referred to as a tunnel barrier layer. One of the two ferromagnetic plates (e.g., the lower ferromagnetic plate 104), is a magnetic layer that is pinned to an antiferromagnetic layer, while the other ferromagnetic plate (e.g., the upper ferromagnetic plate 102) is a "free" magnetic layer that can have its magnetic field changed to one of two or more values to store one of two or more corresponding data states.

The MTJ 100 uses tunnel magnetoresistance (TMR) to store magnetic fields on the upper and lower ferromagnetic plates 102, 104. For sufficiently thin insulating layer 106 thicknesses (e.g., about 10 nm or less), electrons can tunnel from the upper ferromagnetic plate 102 to the lower ferromagnetic plate 104. Data may be written to the cell in a variety of ways. In one method, current is passed between the upper and lower ferromagnetic plates 102, 104, which induces a magnetic field which is stored in the free magnetic layer (e.g., the upper ferromagnetic plate 102). In another method, spin-transfer-torque (STT) is utilized, wherein a spin-aligned or polarized electron flow is used to change the magnetic field within the free magnetic layer with respect to the pinned magnetic layer. Other methods to write data may be used. However, all data write methods include changing the magnetic field within the free magnetic layer with respect to the pinned magnetic layer.

The electrical resistance of the MJT 100 changes in accordance with the magnetic fields stored on the upper and lower ferromagnetic plates 102, 104, due to the magnetic tunnel effect. For example, in FIG. 1A the magnetic fields of the upper and lower ferromagnetic plates 102, 104 are aligned (see arrows 108A, 110A), resulting in a low-resistance state (i.e., a logical "0" state). In FIG. 1B a current has been passed through the MJT 100 to induce a change in the magnetic field of the magnetic free layer (e.g., upper ferromagnetic plate 102). Therefore, after this data write operation the magnetic fields in of the upper and lower ferromagnetic plates 102, 104 oppose one another (see arrows 110A, 110B), which gives rise to a high resistance state (i.e., a logical "1" state). Hence, by measuring the electrical resistance between the upper and lower ferromagnetic plates 102, 104, read circuitry coupled to the MJT 100 can discern between "0" and "1" data states.

Figure 1C:
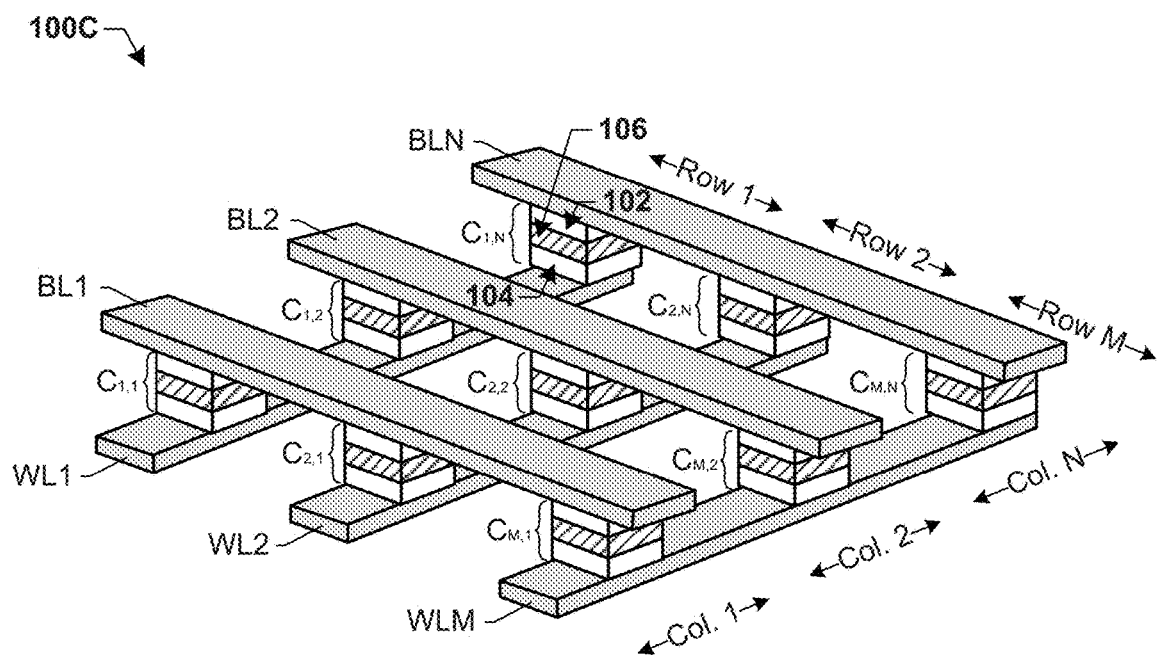
FIG. 1C illustrates an MRAM cell array.

FIG. 1C illustrates an MRAM cell array 100C, which includes M rows (words) and N columns (bits) of MRAM cells, each comprising an MJT 100, wherein individual cells are labeled $C_{row-column}$. Wordlines WL1, ..., WLM extend across respective rows of memory cells and bitlines BL1, ..., BLN extend along columns. To write data to a row of cells, a wordline (WL) is asserted to select a row and appropriate biases are applied to the individual bitlines (BLs) to write respective values to the respective MRAM cells of the selected row. When data is written to or read from multiple cells along a row (e.g., a multi-bit word), data errors can occur for one or more MRAM cells due manufacturing variations across the memory array can lead to erroneous bits being written to the MRAM cell array 100C.

For MRAM cell arrays patterned at the lower resolution limit of optical lithography, non-uniformity in the dimensions of the MJT 100 within the MRAM cells of the MRAM cell array 100C drives a non-uniform current density and variation in read/write characteristics between the MRAM cells. Non-uniformity in the dimensions of the MJT 100 also leads to a variation in coercivity between the MRAM cells due to the size variation. Additionally, the size and density of the MJT 100 is limited by the lower resolution limit of optical lithography (i.e., width lower limit of about 40 nm). Variation in the volume of the MJT 100 also leads to non-uniform thermal stability which also contributes to variable magnetoresistance between the MRAM cells.

Accordingly, some embodiments of the present disclosure relate to a method that achieves a substantially uniform pattern of MTJs within MRAM cells of an MRAM cell array, and further achieves a minimum MJT dimension below the lower resolution limit of some optical lithography techniques. A copolymer solution comprising first and second polymer species is spin-coated over a heterostructure which resides over a surface of a substrate, wherein the heterostructure comprises first and second ferromagnetic layers which are separated by an insulating layer. The copolymer solution is subjected to self-assembly into a phase-separated material comprising a regular pattern of micro-domains of the second polymer species within a polymer matrix comprising the first polymer species. The first polymer species is then removed resulting with a pattern of micro-domains of the second polymer species. A pattern of magnetic memory cells within the heterostructure is formed by etching through the heterostructure while utilizing the pattern of micro-domains formed by the second polymer species as a hardmask.

Figure 2A:
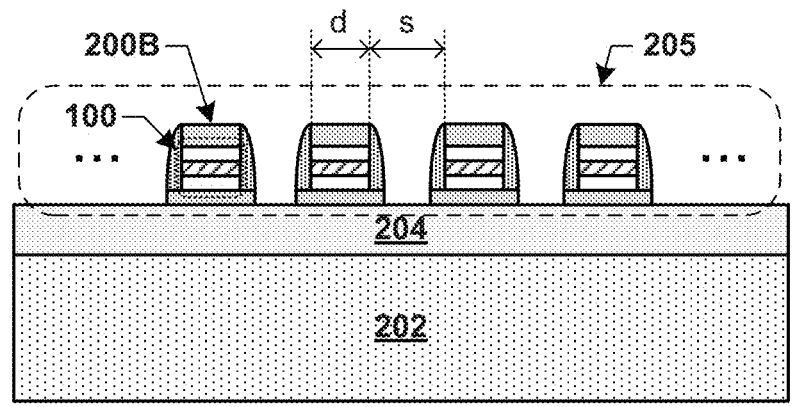
FIGS. 2A-2B illustrate cross-sectional views of some embodiments of a magnetic memory device.

FIG. 2A illustrates a cross-sectional view of some embodiments of a magnetic memory device 200A, comprising an array 200C of MRAM cells 200B. The memory device 200A is formed on a dielectric material 204 disposed over a substrate 202. In some embodiments, the substrate 202 comprises silicon (Si) or silicon-on-insulator (SOI). Alternatively, the substrate 202 may comprise another elementary semiconductor. In some embodiments, the dielectric material 204 comprises silicon dioxide ($SiO_2$). Each MRAM cell 200B comprises an MJT 100 with a diameter (d) of less than 100 nm. Moreover, the space (s) between adjacent MJTs 100 within the array 200C is also less than 100 nm. In some embodiments, the diameter (d) or space (s) of the MJTs 100 is less than 40 nm, when formed with the tools and methods disclosed herein.

Figure 2B:
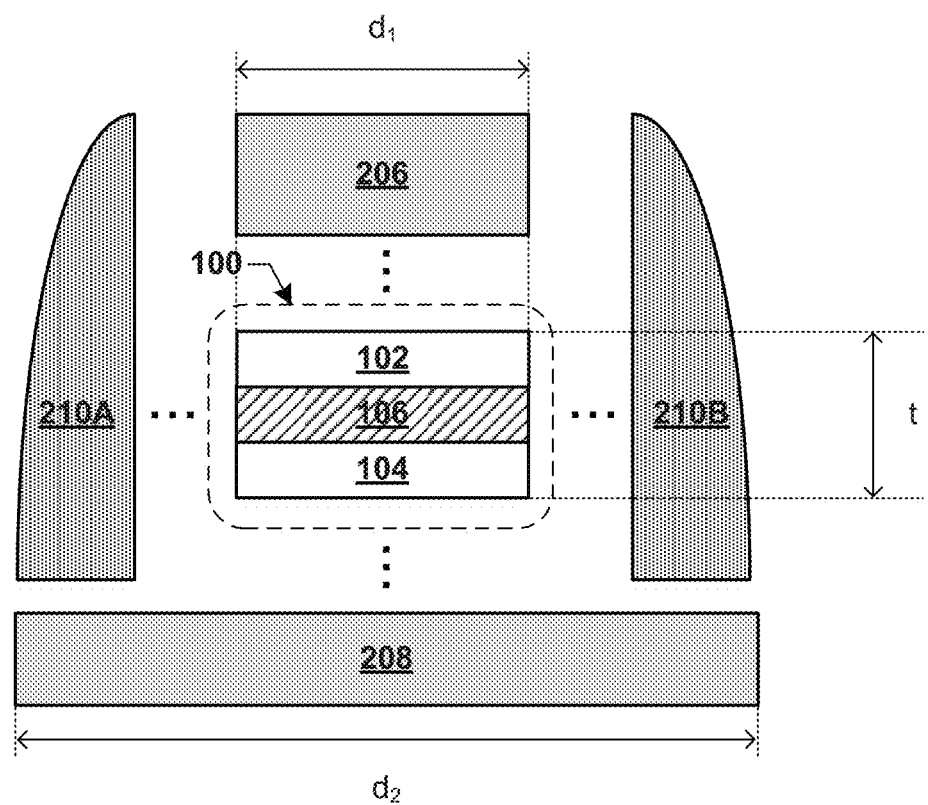

FIG. 2B illustrates a cross-sectional view of some embodiments of the MRAM cell 200B, comprising an MJT 100 which comprises upper and lower ferromagnetic plates 102, 104 which are separated by an insulating layer 106. In some embodiments, the upper and lower ferromagnetic plates 102, 104 comprise cobalt iron boron (CoFeB), cobalt iron (CoFe), a cobalt/palladium (Co/Pd) multilayer structure, a cobalt platinum (Co/Pt) multilayer structure, or a combination thereof. In some embodiments, the insulating layer 106 comprises magnesium oxide (MgO). In some embodiments, the lower ferromagnetic plate 104 is formed on an antiferromagnetic layer (not shown) to fix an orientation of the magnetic field within the lower ferromagnetic plate 104, while leaving the orientation of the magnetic field within the upper ferromagnetic plate 102 free to change orientation to achieve memory storage within the MRAM cell 200B. In some embodiments, a capping layer (not shown) is disposed over the upper ferromagnetic plate 102, wherein the capping layer may include aluminum oxide (AlOx), MgO, tantalum (Ta), ruthenium (Ru), a combination thereof, or any other suitable dielectric material. In some embodiments, the MJT 100 comprises a thickness (t) of less than 300 nm. In some embodiments, the MJT 100 comprises a cylindrical shape with a first diameter ($d_1$) less than 40 nm.

The MRAM cell 200B further comprises first and second spacers 210A, 210B vertically-disposed adjacent the MJT 100, and configured to provide lateral isolation of the MJT 100. In some embodiments, the first and second spacers 210A, 210B one or more materials selected from the group consisting of silicon nitride (SiN), silicon oxide (SiOx), or silicon oxynitride (SiON). Other embodiments may utilize other suitable dielectric materials for isolation.

The MRAM cell 200B further comprises upper and lower electrodes 206, 208 which contact the upper and lower ferromagnetic plates 102, 104, respectively. In some embodiments, the upper and lower electrodes 206, 208 comprise tantalum (Ta), chromium (Cr), gold (Au), ruthenium (Ru), or a combination thereof. In some embodiments, the upper and lower electrodes 206, 208 comprise a thickness in a range of about 10 nm to about 100 nm. In some embodiments, the lower electrodes 208 comprises a cylindrical shape with a second diameter ($d_2$) which is greater than the first diameter ($d_1$) of the MJT 100 and upper electrode 206.

Figure 2C:
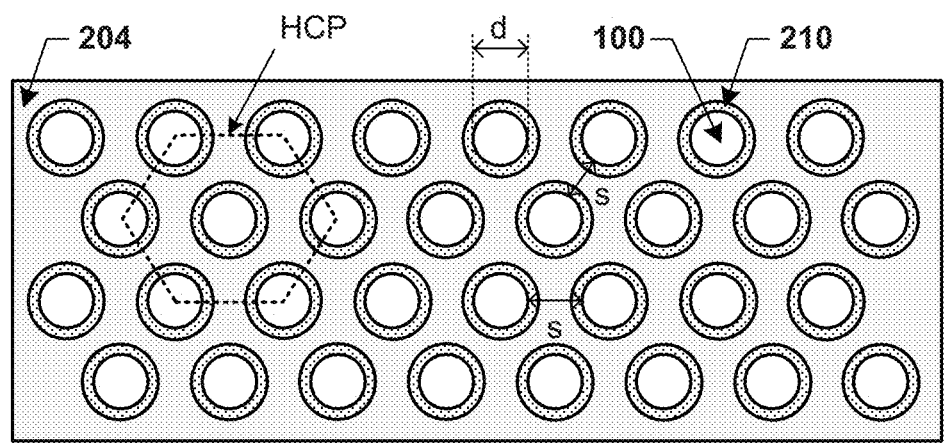
FIG. 2C illustrates a top-down view of some embodiments of a magnetic memory cell array.

FIG. 2C illustrates a top-down view of some embodiments of the magnetic memory cell array 200C, formed in accordance with the patterning methods of the present disclosure. The memory cell array 200C comprises MJTs 100 disposed on the dielectric material 204 and surrounded by a sidewall material 210 from which the first and second spacers 210A, 210B are formed. For the embodiments of FIGS. 2A-2C, the memory cell array 200C is configured in a periodic hexagonal close-packed (HCP) arrangement, wherein the MJTs 100 comprises a diameter (d) and minimum space (s) of less than 40 nm.

Figure 3:
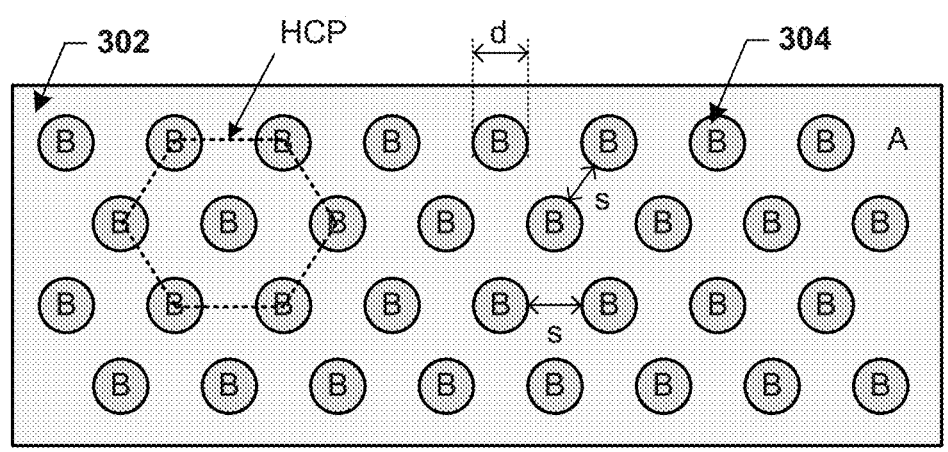
FIG. 3 illustrates a top-down view of some embodiments of a block copolymer utilized to form the magnetic memory cell array of FIGS. 2A-2C.

The magnetic memory cell array 200C of the embodiments of FIGS. 2A-2C is formed through a pattern transfer from a block copolymer 300 as illustrated in FIG. 3 by patterning methods disclosed in subsequent embodiments herein. The block copolymer 300 comprises first and second polymer species A, B, wherein the first polymer species A forms a polymer matrix 302, wherein a plurality of micro-domains 304 of the second polymer species B reside in an HCP arrangement, and wherein the micro-domains 304 comprises a diameter (d) and minimum space (s) of less than 40 nm.

In some embodiments, formation of the block copolymer 300 comprises spin-coating a substrate with a copolymer solution comprising the first and second polymer species A, B. The substrate is then annealed through a thermal anneal or solvent anneal process, which results in a self-assembly of the copolymer solution into a phase-separated material (i.e., block copolymer 300). The first polymer species A may then be removed (i.e., the polymer matrix 302) through an oxygen reactive ion etch (RIE), which leaves the pattern of micro-domains 304 of the second polymer species B which form a hardmask (HM) for patterning.

Figure 4A:
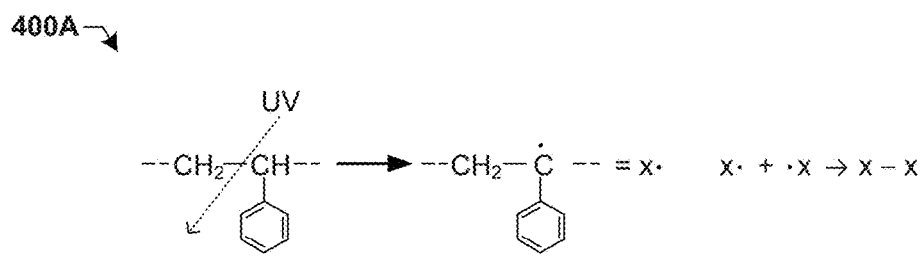
FIGS. 4A-4C illustrate some embodiments of direct self-assembly (DSA) of first and second polymer species within a copolymer solution into a polymer matrix comprising micro-domains.
Figure 4B:
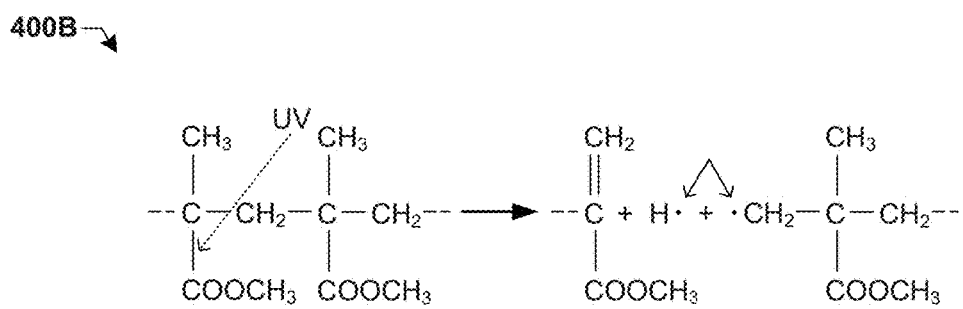

In some embodiments, the copolymer solution comprises poly(styrene-block-methylmethacrylate) (PS-b-PMMA), wherein the first polymer species A comprises poly(methyl methacrylate) (PMMA), and the second polymer species B comprises polystyrene (PS). In some embodiments, the PS-b-PMMA block copolymer 300 is spin-coated onto a substrate, and promoted to self-assemble by thermal annealing or by solvent annealing an inert atmosphere, to achieve a cylindrical phase block copolymer film, wherein the PMMA forms the polymer matrix, and the PS forms the pattern of self-assembled cylindrical micro-domains oriented parallel the surface of the substrate. The copolymer film is then irradiated with ultraviolet (UV) radiation, which promotes cross-linking of the PS molecules through the removal of one hydrogen from a benzene-bonded carbon of the PS polymer chain, such that two PS polymer units 400A or chains of such ionized units may cross-link, as illustrated in FIG. 4A. The UV radiation simultaneously degrades the PMMA polymer unit 400B through the removal of one hydrogen from a methylidene molecule ($CH_2$) bonded to two carbons of the PMMA polymer unit 400B, as illustrated in FIG. 4B. After UV irradiation, the PMMA may be removed through an oxygen (e.g., $O_2$ plasma) RIE.

Figure 4C:
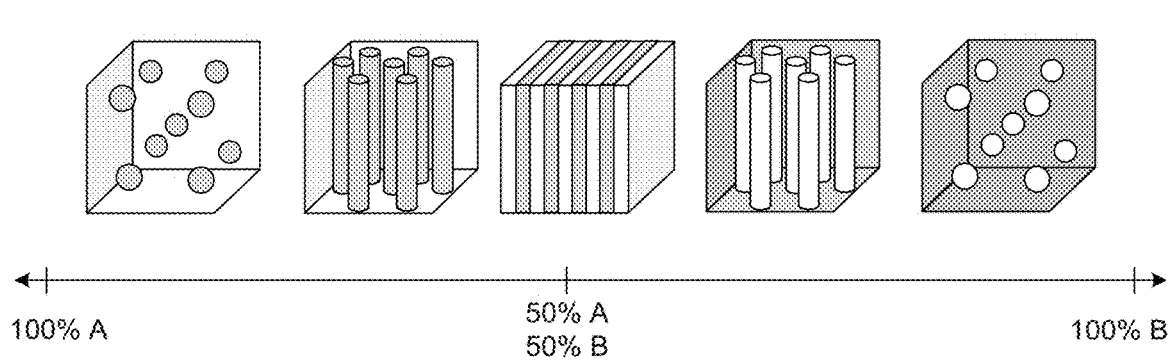

In various embodiments, the PMMA may form the micro-domains within the PS matrix, or the PMMA may form the matrix comprising PS micro-domains. FIG. 4C, illustrates some embodiments of various morphologies 400C of the first and second polymer species, A, B as a function of relative volume fraction. For a nearly equal volume fraction of the first and second polymer species A, B in an equilibrium configuration, a lamellar (layered) copolymer structure is formed. Cylindrical micro-domain structures are formed as the volume fraction of species A or B is decreased relative to species B or A. Spherical micro-domains form the when the volume fraction of species A or B is further decreased relative to species B or A. The values of volume fractions that achieve these volume-fraction-dependent morphologies are dependent upon the conditions under which the copolymer was formed (e.g., the annealing conditions) as well as the types of first and second polymer species A, B. For the embodiments of FIG. 3, the polymer matrix 302 comprises PMMA which is removed, leaving the micro-domains 304 comprising PS to act as a hardmask (HM) for patterning.

Figure 5C:
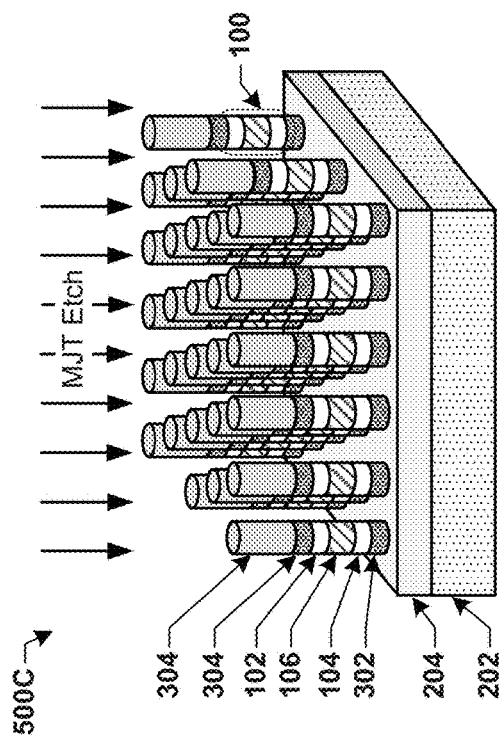
FIGS. 5A-5D of illustrate perspective views of some embodiments of MRAM cell array patterning with a block copolymer.
Figure 5D:
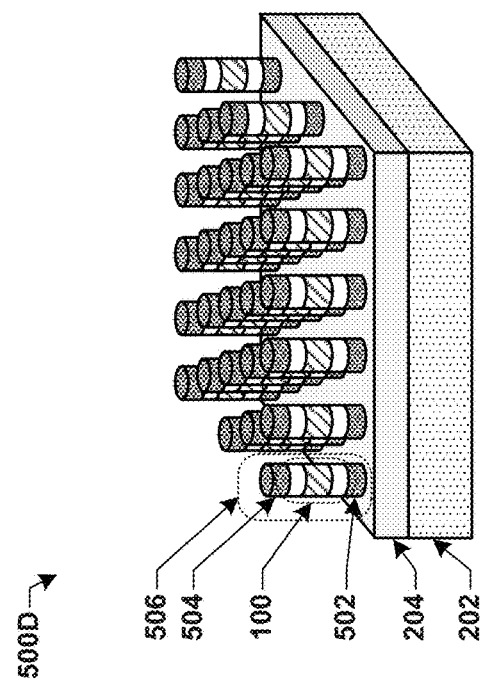
Figure 5A:
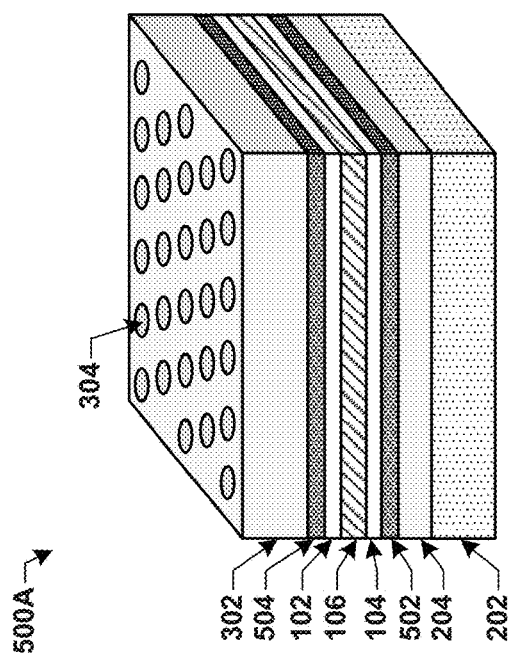

FIGS. 5A-5D of illustrate perspective views of some embodiments of MRAM cell array patterning with a block copolymer. FIG. 5A illustrates a perspective view of a patterning stack 500A, comprising a substrate 202 (e.g., Si) whereupon a layer of dielectric material 204 (e.g., $SiO_2$) is disposed. A bottom electrode layer 502 (e.g., Ta) is disposed through an appropriate layer growth techniques. Some layer growth techniques comprise sputter deposition, molecular beam epitaxy (MBE), pulsed laser deposition (PLD), atomic layer deposition (ALD) and electron beam (e-beam) epitaxy, chemical vapor deposition (CVD), or derivative CVD processes further comprising low pressure CVD (LPCVD), atomic layer CVD (ALCVD), ultrahigh vacuum CVD (UHVCVD), reduced pressure CVD (RPCVD), or any combinations thereof.

Above the bottom electrode layer 502, a heterostructure is formed comprising first and second ferromagnetic layers 102, 104 (e.g., CoFeB) which are separated by an insulating layer 106 (e.g., MgO). Above the heterostructure a top electrode layer 504 (e.g., Ta) is disposed through an appropriate layer growth technique.

Figure 5B:
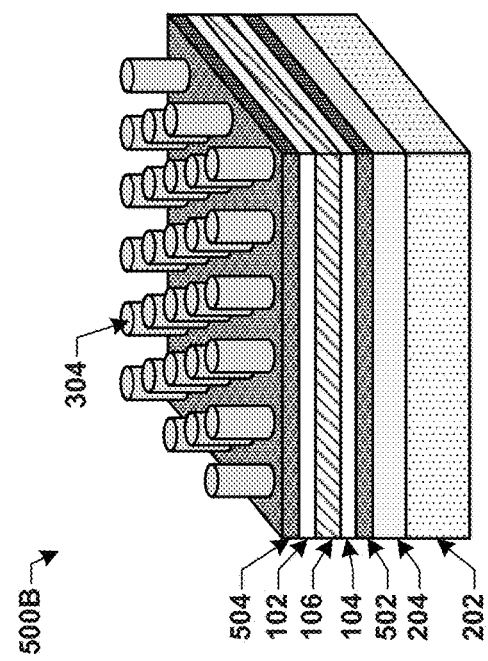

Above the top electrode layer 504, a block copolymer is formed comprising a polymer matrix 302 comprising a first polymer species (e.g., PMMA), and a pattern of micro-domains 304 formed within the polymer matrix 302 by a second polymer species (e.g., PS). In some embodiments, the micro-domains 304 reside in an HCP arrangement, and comprises a cylindrical shape with a diameter and minimum space of less than 40 nm. In some embodiments, the block copolymer comprises a thickness of less than 1,000 angstroms FIG. 5B illustrates a perspective view of a patterning stack 500B, comprising the patterning stack 500A, wherein the polymer matrix 302 has been removed through an etch process (e.g., $O_2$ plasma RIE), forming a pattern of polymer pillars (e.g., remaining micro-domains 304) comprising the second polymer species over the patterning stack 500B.

FIG. 5C illustrates a perspective view of a patterning stack 500C, comprising the patterning stack 500B, wherein an etch is performed through the top and bottom electrode layers 504, 502, and the heterostructure (102, 104, 106), by utilizing the pattern of polymer pillars (304) as a hardmask. The etch may comprise a dry etch, wet etch, or a combination thereof. As a result of the etch, a pattern of cylindrical shapes is formed, which is substantially identical to the pattern polymer pillars (304) (i.e., an HCP arrangement of the cylindrical shapes with a diameter and minimum space of less than 40 nm).

FIG. 5D illustrates a perspective view of a patterning stack 500D, comprising the patterning stack 500C, wherein the polymer pillars (304) have been removed by an etch process (e.g., RIE), leaving a pattern of magnetic memory cells 506, wherein a magnetic memory cell 506 comprises a top electrode formed from the a top electrode layer 504, a bottom electrode formed from the bottom electrode layer 502, and an MJT 100 formed from the first and second ferromagnetic layers 102, 104, and the insulating layer 106.

FIGS. 6A-6F of illustrate cross-sectional views of some embodiments of MRAM cell array patterning with a block copolymer and hardmask (HM). FIG. 6A illustrates a cross-sectional view of a patterning stack 600A, comprising a substrate 202 whereupon a layer of dielectric material 204 is disposed. A heterostructure is formed over the layer of dielectric 204 material, wherein the heterostructure comprises a top and bottom electrode layers 504, 502 disposed above and below an MJT layer, wherein the MJT layer comprises first and second ferromagnetic layers 102, 104 which are separated by an insulating layer 106.

A first hardmask (HM) layer 602 is disposed over the heterostructure (i.e., top electrode layer 504) by an appropriate layer deposition technique (e.g., ALD, CVD, etc.). In some embodiments, the first HM layer 602 comprises oxide (Ox), silicon oxynitride (SiOx), silicon nitride (SiN), silicon oxycarbide (SiOC), silicon carbide (SiC), or suitable combination thereof. Above the first HM layer 602 a block copolymer is formed comprising a polymer matrix 302 comprising a first polymer species, and a micro-domain 304 formed within the polymer matrix 302 by a second polymer species.

FIG. 6B illustrates a cross-sectional view of a patterning stack 600B, comprising the patterning stack 600A, wherein the polymer matrix 302 is removed, leaving the micro-domain 304 which forms a pillar to serve as a second HM layer.

FIG. 6C illustrates a cross-sectional view of a patterning stack 600C, comprising the patterning stack 600B, wherein a first etch has been performed through the top electrode layer 504 and MJT layer (102, 104, 106). In some embodiments, the first etch may comprise transfer of the pattern of the polymer pillar (304) (e.g., cylindrical pattern) into the first HM layer 602 trough an intermediate etch step, followed by the removal of the polymer pillar (304) prior to the etch. In some embodiments, the first etch may utilize the first HM layer 602 and the polymer pillar (304) as a second HM layer together with no intermediate etch step.

In some embodiments, the first HM layer 602 and the polymer pillar (304) are removed after the first etch, as illustrated in the embodiments patterning stack 600D of FIG. 6D. In some embodiments, the polymer pillar (304) is removed and the first HM layer 602 is left for subsequent patterning steps. In some embodiments, both the first HM layer 602 and the polymer pillar (304) are left for subsequent patterning steps.

FIG. 6E illustrates a cross-sectional view of a patterning stack 600E, comprising the patterning stack 600D, wherein a sidewall material (210) is deposited over the patterning stack 600D, and etched to remove portions of the sidewall material (210) horizontally-disposed on the surface of the top and bottom electrode layers 504, 502, while leaving portions of the vertically-disposed sidewall material (210) adjacent the top electrode layer 504 and MJT 100 substantially intact, which form first and second spacers 210A, 210B. In some embodiments, the sidewall material (210) is deposited using ALD, CVD, or another appropriate method, and can be any suitable dielectric (e.g., SiN, SiOx, and SiON), and may be deposited in situ to minimize contamination.

FIG. 6F illustrates a cross-sectional view of a patterning stack 600F, comprising the patterning stack 600E, wherein a second etch is performed to etch through the bottom electrode layer 502 by utilizing the top electrode layer 504 and vertically-disposed first and second spacers 210A, 210B as third HM layer to form an MRAM cell. The MRAM cell comprises a top electrode formed from the top electrode layer 504, an MJT 100 comprising the etched MJT layer, and a bottom electrode formed from the bottom electrode layer 502, wherein the bottom electrode is wider than the top electrode.

Figure 7:
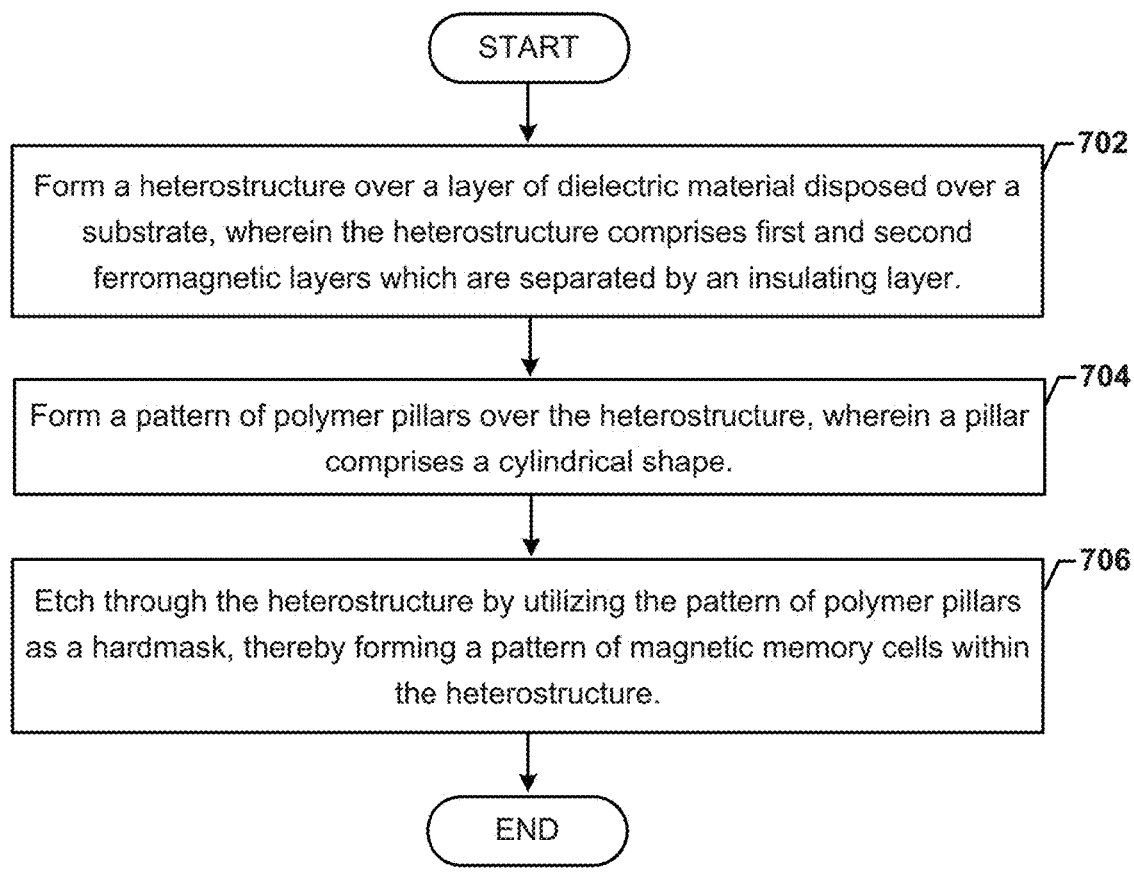
FIG. 7 illustrates some embodiments of a method of forming an MRAM cell array with a copolymer.

FIG. 7 illustrates some embodiments of a method 700 of forming an MRAM cell array with a copolymer. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702 a heterostructure is formed over a layer of dielectric material disposed over a substrate, wherein the heterostructure comprises first and second ferromagnetic layers which are separated by an insulating layer.

At 704 a pattern of polymer pillars is formed over the heterostructure, wherein a pillar comprises a cylindrical shape.

At 706 a pattern of magnetic memory cells is formed within the heterostructure by etching through the heterostructure while utilizing the pattern of polymer pillars as a hardmask.

Figure 8:
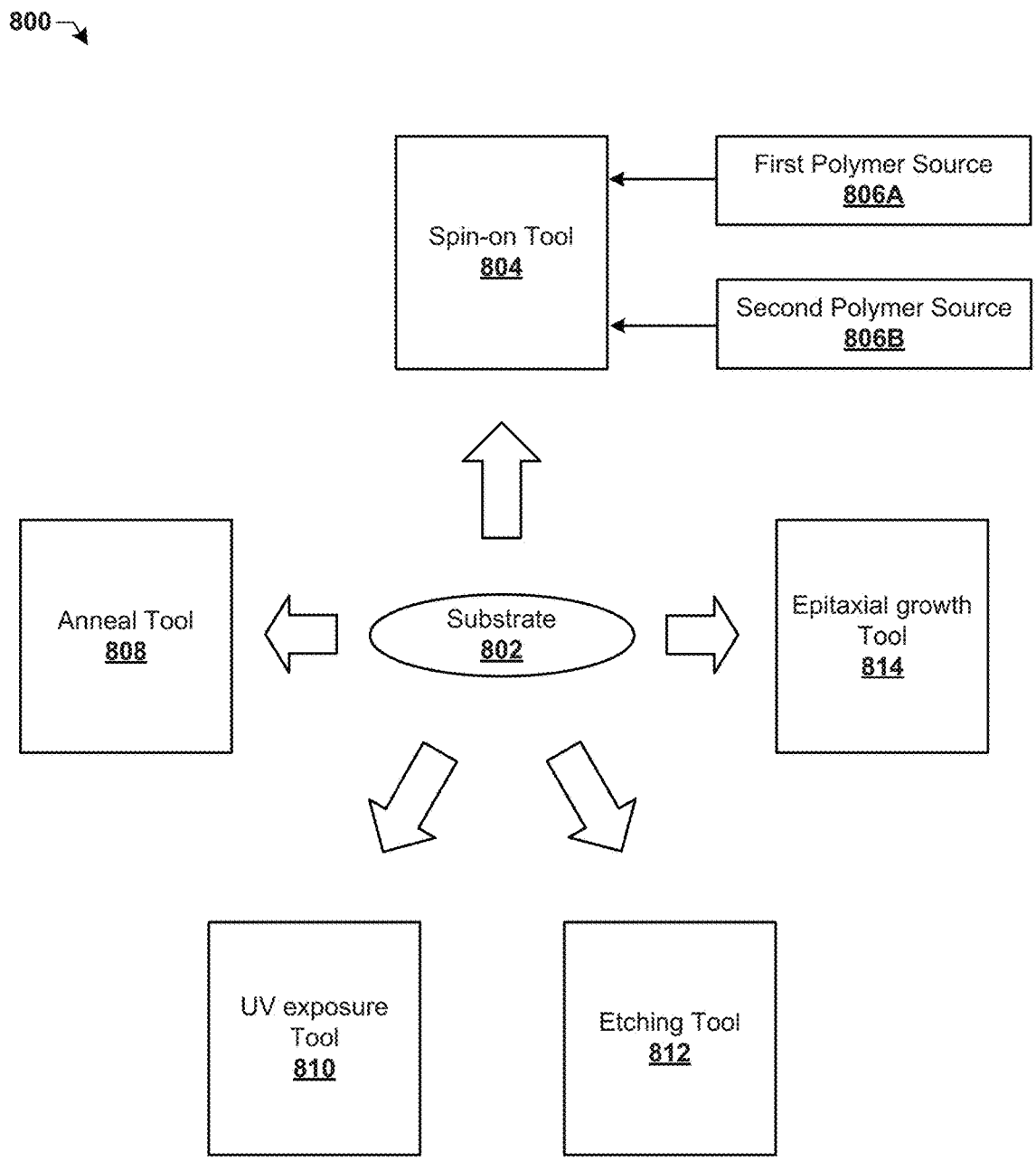
FIG. 8 illustrates some embodiments of a tool arrangement configured to form an MRAM cell array with a copolymer.

FIG. 8 illustrates some embodiments of a tool arrangement 800 configured to form an MRAM cell array with a copolymer on a substrate 802. The tool arrangement 800 comprises a spin-on tool 804 configured to receive first and second polymer species 806A, 806B, and spin-coat the substrate with a copolymer solution comprising the first and second polymer species 806A, 806B. The tool arrangement 800 further comprises an anneal tool 808. In some embodiments, the anneal tool 808 comprises an oven configured to subject the substrate 802 thermal annealing. In some embodiments, the anneal tool 808 comprises a solvent annealing tool configured to subject the substrate 802 to an inert atmosphere (e.g., argon, etc.). The anneal tool 808 is configured to achieve direct self-alignment (DSA) of the copolymer film into a polymer matrix comprising the first or second polymer species 806A, 806B occupied by microdomains comprising the second or first polymer species 806B, 806A, respectively.

The tool arrangement 800 further comprises a UV exposure tool 810 configured to provide UV radiation to the substrate 802. In some embodiments, the UV radiation results in cross-linking of units of the first or second polymer species 806A, 806B, while simultaneously degrading linkage between units of the second or first polymer species 806B, 806A, respectively.

The tool arrangement 800 further comprises an etching tool 812. In some embodiments, the etching tool 812 is configured to subject the substrate 802 to a RIE process (e.g., $O_2$ plasma RIE) to remove the first or second polymer species 806A, 806B from the polymer matrix. In some embodiments, the etching tool 812 is configured to subject the substrate 802 to a dry etch for MJT patterning while utilizing polymer matrix as an HM. In some embodiments, the etching tool 812 is configured to expose the substrate 802 to a continuous flow of one or more dry etchants, wet etchants, or a combination of both.

The tool arrangement 800 further comprises an epitaxial growth tool 814 configured to deposit material on the substrate 802 through sputter deposition, MBE, PLD, ALD, e-beam epitaxy, or CVD or derivative processes. In some embodiments, the epitaxial growth tool 814 comprises a vacuum or ultra-low vacuum (UHV) chamber configured for in situ processing of the substrate 802.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

Therefore, some embodiments of the present disclosure relate to a method that achieves a substantially uniform pattern of magnetic random access memory (MRAM) cells with a minimum dimension below the lower resolution limit of some optical lithography techniques. A copolymer solution comprising first and second polymer species is spin-coated over a heterostructure which resides over a surface of a substrate. The heterostructure comprises first and second ferromagnetic layers which are separated by an insulating layer. The copolymer solution is subjected to self-assembly into a phase-separated material comprising a pattern of micro-domains of the second polymer species within a polymer matrix comprising the first polymer species. The first polymer species is then removed, leaving a pattern of micro-domains of the second polymer species. A pattern of magnetic memory cells within the heterostructure is formed by etching through the heterostructure while utilizing the pattern of micro-domains as a hardmask.

In some embodiments, a method of forming a magnetic memory cell is disclosed, The method comprises forming a heterostructure over a layer of dielectric material disposed over a substrate, wherein the heterostructure comprises first and second ferromagnetic layers which are separated by an insulating layer. The method further comprises forming a pattern of polymer pillars over the heterostructure, wherein a pillar comprises a cylindrical shape. The method further comprises forming a pattern of magnetic memory cells within the heterostructure comprising etching through the heterostructure by utilizing the pattern of polymer pillars as a hardmask.

In some embodiments, a method of forming a magnetic memory cell is disclosed. The method comprises forming a heterostructure over a layer of dielectric material disposed over a substrate, wherein the heterostructure comprises a top and bottom electrode layers disposed above and below a magnetic tunneling junction layer, and wherein the magnetic tunneling junction layer comprises first and second ferromagnetic layers which are separated by an insulating layer. The method further comprises forming a first hardmask layer over the heterostructure. The method further comprises spin-coating a copolymer solution over the first hardmask layer, wherein the copolymer solution comprising first and second polymer species, and annealing the substrate which results in a self-assembly of the copolymer solution into a phase-separated material, wherein the first polymer species forms the polymer matrix, and the second polymer species forms a pattern of micro-domains within the polymer matrix. The method further comprises removing the first polymer species which removes the polymer matrix and leaves the pattern of micro-domains of the second polymer species which form the pattern of polymer pillars for patterning of the heterostructure.

In some embodiments, a magnetic memory device is disclosed, comprising a substrate and a magnetic tunneling junction disposed over a surface of the substrate. The magnetic tunneling junction further comprises a first ferromagnetic layer, a second ferromagnetic layer, and an insulating layer which separates the first and second ferromagnetic layers, wherein the magnetic tunneling junction further comprises a cylindrical shape diameter of less than 40 nm.

In some embodiments, a magnetic memory device comprising a magnetic tunneling junction, a top electrode, and a spacer is provided. The magnetic tunneling junction overlies a bottom electrode, and comprises a first ferromagnetic layer, an insulating layer overlying the first ferromagnetic layer, and a second ferromagnetic layer overlying the insulating layer. A width of the magnetic tunneling junction is less than about 40 nanometers. The top electrode overlies the magnetic tunneling junction, and sidewall surfaces of the top electrode and the magnetic tunneling junction are substantially coplanar. The spacer is arranged over the bottom electrode, and the spacer lines the sidewall surfaces of the top electrode and the magnetic tunneling junction. The spacer is arranged laterally between sidewall surfaces of the magnetic tunneling junction and the bottom electrode.

In some embodiments, a magnetic memory device comprising first and second magnetic tunneling junctions and a sidewall spacer is provided. The first magnetic tunneling junction comprises a first ferromagnetic layer, a first insulating layer overlying the first ferromagnetic layer, and a second ferromagnetic layer overlying the first insulating layer. The sidewall spacer lines sidewall surfaces of the first and second ferromagnetic layers and the first insulating layer. The second magnetic tunneling junction comprises a third ferromagnetic layer, a second insulating layer overlying the third ferromagnetic layer, and a fourth ferromagnetic layer overlying the second insulating layer.

What is claimed is:

1. A magnetic memory device, comprising:
   a substrate;
   a magnetic tunneling junction disposed over a surface of the substrate, comprising:
      a first ferromagnetic layer;
      a second ferromagnetic layer; and
      an insulating layer which separates the first and second ferromagnetic layers;
      wherein the magnetic tunneling junction further comprises a first cylindrical shape with a diameter of less than about 100 nm; and
   a top electrode overlying and directly contacting the magnetic tunneling junction;
   a dielectric hard mask overlying and directly contacting the top electrode;
   a polymer pillar overlying and directly contacting the dielectric hard mask, wherein the polymer pillar comprises poly(methyl methacrylate) (PMMA) or polystyrene (PS), and wherein a planar top layout of the polymer pillar is the same as that of the dielectric hard mask, the top electrode, and the magnetic tunneling junction; and
   a sidewall spacer surrounding the first cylindrical shape of the magnetic tunneling junction, wherein the sidewall spacer has an inner edge vertically disposed adjacent to sidewalls of the first or second ferromagnetic layer and the insulating layer, and further has a curvilinear outer edge that is vertically disposed and that is opposite the inner edge.

2. The magnetic memory device of claim 1, wherein the magnetic memory device resides in an array of magnetic memory devices having a plurality of magnetic tunneling junctions, and wherein a space between adjacent magnetic tunneling junctions is less than approximately 40 nm.

3. The magnetic memory device of claim 1, wherein the second ferromagnetic layer is formed on an antiferromagnetic layer to fix an orientation of a magnetic field within the second ferromagnetic layer, while leaving the orientation of the magnetic field within the first ferromagnetic layer unfixed.

4. The magnetic memory device of claim 1, further comprising:
   a bottom electrode underlying the magnetic tunneling junction, wherein the sidewall spacer extends laterally from about even with a sidewall surface of the magnetic tunneling junction to about even with a sidewall surface of the bottom electrode.

5. The magnetic memory device of claim 4, wherein the top and bottom electrodes comprise tantalum, chromium, gold, ruthenium, or a combination thereof, and wherein the first and second ferromagnetic layers comprise cobalt, iron, boron, palladium, platinum, or a combination thereof.

6. The magnetic memory device according to claim 4, wherein the insulating layer has a thickness of about 10 nanometers, wherein the top electrode has a thickness of about 10 nanometers, wherein the bottom electrode has a thickness of about 10 nanometers, and wherein the diameter of the first cylindrical shape is less than about 40 nanometers.

7. The magnetic memory device according to claim 1, wherein the curvilinear outer edge arcs continuously from an interface with the inner edge to a location spaced below a top surface of the magnetic tunneling junction.

8. The magnetic memory device of claim 1, further comprising:
a bottom electrode underlying the magnetic tunneling junction, wherein the bottom electrode comprises a second cylindrical shape with a diameter greater than the diameter of the first cylindrical shape.

9. The magnetic memory device according to claim 1, wherein the diameter of the first cylindrical shape is less than about 40 nanometers.

10. A magnetic memory device, comprising:
a dielectric layer;
a bottom electrode overlying the dielectric layer, wherein the bottom electrode comprises a pair of bottom electrode sidewalls when viewed in cross section, wherein the bottom electrode sidewalls are respectively on opposite sides of the bottom electrode, and wherein the bottom electrode directly contacts the dielectric layer continuously from one of the bottom electrode sidewalls to another one of the bottom electrode sidewalls;
a magnetic tunneling junction overlying and directly contacting a top surface of the bottom electrode, and comprising a first ferromagnetic layer, an insulating layer overlying the first ferromagnetic layer, and a second ferromagnetic layer overlying the insulating layer, wherein a width of the magnetic tunneling junction is less than about 40 nanometers, and wherein the bottom electrode is continuous from a bottom surface of the bottom electrode to the top surface of the bottom electrode;
a top electrode overlying and directly contacting the magnetic tunneling junction, wherein a sidewall surface of the top electrode and a sidewall surface of the magnetic tunneling junction are substantially coplanar; and
a spacer arranged over the bottom electrode, wherein the spacer has an inner edge in direct contact with the sidewall surface of the top electrode and the sidewall surface of the magnetic tunneling junction, and further has a curvilinear outer edge that is vertically disposed and that is opposite the inner edge, wherein the curvilinear outer edge extends from the sidewall surface of the top electrode to one of the pair of bottom electrode sidewalls, wherein the spacer is arranged laterally between the sidewall surface of the magnetic tunneling junction and a sidewall surface of the bottom electrode, and wherein the sidewall surface of the bottom electrode is defined by the one of the pair of bottom electrode sidewalls.

11. The magnetic memory device according to claim 10, wherein the spacer extends vertically from about even with the top surface of the bottom electrode to about even with an upper surface of the top electrode.

12. The magnetic memory device according to claim 10, wherein the insulating layer has a thickness of about 10 nanometers, wherein the top electrode has a thickness of about 10 nanometers, and wherein the bottom electrode has a thickness of about 10 nanometers.

13. The magnetic memory device according to claim 10, wherein the top and bottom electrodes comprise tantalum, chromium, gold, ruthenium, or a combination thereof, and wherein the first and second ferromagnetic layers comprise cobalt, iron, boron, palladium, platinum, or a combination thereof.

14. A magnetic memory device, comprising:
a first magnetic tunneling junction comprising a first ferromagnetic layer, a first insulating layer overlying the first ferromagnetic layer, and a second ferromagnetic layer overlying the first insulating layer;
a top electrode overlying and directly contacting the first magnetic tunneling junction, wherein the top electrode has the same planar top layout as the first magnetic tunneling junction;
a bottom electrode underlying and directly contacting a lower portion of the first magnetic tunneling junction;
a sidewall spacer overlying and directly contacting the bottom electrode, wherein the sidewall spacer has a line-shaped inner edge that is in direct contact with sidewall surfaces of the first and second ferromagnetic layers and the first insulating layer, wherein the sidewall spacer further has a curvilinear outer edge that arcs continuously from an interface with the line-shaped inner edge to direct contact with a top corner of the bottom electrode, and wherein the interface directly contacts a top edge of the top electrode; and
a second magnetic tunneling junction comprising a third ferromagnetic layer, a second insulating layer overlying the third ferromagnetic layer, and a fourth ferromagnetic layer overlying the second insulating layer.

15. The magnetic memory device according to claim 14, wherein a width of the first or second magnetic tunneling junction is less than about 40 nanometers.

16. The magnetic memory device according to claim 14, wherein a distance between the first and second magnetic tunneling junctions is less than about 40 nanometers.

17. The magnetic memory device according to claim 14, wherein the sidewall surfaces of the first and second ferromagnetic layers and the first insulating layer are substantially coplanar.

18. The magnetic memory device according to claim 14, further comprising a second bottom electrode underlying the third ferromagnetic layer, and wherein the sidewall spacer is arranged laterally between sidewalls respectively of the first ferromagnetic layer and the bottom electrode.

19. The magnetic memory device according to claim 14, further comprising:
an array of magnetic tunneling junctions, including the first and second magnetic tunneling junctions, wherein the magnetic tunneling junctions of the array are arranged in a hexagonal close-packed arrangement.

20. The magnetic memory device according to claim 14, further comprising a dielectric layer underlying the bottom electrode and the second magnetic tunneling junction, wherein the bottom electrode directly contacts the dielectric layer continuously along an entire width of the bottom electrode.

* * * * *